(12) United States Patent
Price

(10) Patent No.: US 7,545,173 B2
(45) Date of Patent: Jun. 9, 2009

(54) LEVEL SHIFT DELAY EQUALIZATION CIRCUIT AND METHODOLOGY

(75) Inventor: Burt Lee Price, Apex, NC (US)

(73) Assignee: Linear Technology Corporation, Milpitas, CA (US)

( * ) Notice: Subject to any disclaimer, the term of this patent is extended or adjusted under 35 U.S.C. 154(b) by 180 days.

(21) Appl. No.: 11/315,146

(22) Filed: Dec. 23, 2005

(65) Prior Publication Data

US 2007/0146007 A1   Jun. 28, 2007

(51) Int. Cl.
*H03K 19/0175* (2006.01)
(52) U.S. Cl. .............................. 326/80; 326/63; 327/333
(58) Field of Classification Search .................... 326/63, 326/68, 81, 83, 86, 87; 327/333, 108–112, 327/201–203, 208–218
See application file for complete search history.

(56) References Cited

U.S. PATENT DOCUMENTS 5,572,156 A * 11/1996 Diazzi et al. ................. 327/109
5,933,034 A * 8/1999 Hastings et al. ............. 327/108
6,351,173 B1 * 2/2002 Ovens et al. ................. 327/333
6,717,453 B2 * 4/2004 Aoki .......................... 327/333

\* cited by examiner

*Primary Examiner*—Rexford N Barnie
*Assistant Examiner*—Christopher Lo
(74) *Attorney, Agent, or Firm*—McDermott Will & Emery LLP

(57) ABSTRACT

Transition delays in a level shift circuit are equalized by generating a first signal related to the state of the input signal, a second signal inversely related to the state of the input signal, and a third signal that is reciprocal to the second signal. Upon transition of the input signal from a high state to a low state, the third signal is selected for controlling the output until the first signal attains a high state. The first signal is selected for controlling the output when it has reached a high state after the input signal transition. The first signal remains selected upon transition of the input signal from a high state to a low state. Thus, output delays are equalized and reduced to the shortest delay.

17 Claims, 6 Drawing Sheets

LEVEL SHIFT DELAY EQUALIZATION CIRCUIT AND METHODOLOGY

TECHNICAL FIELD

The present disclosure relates to level shifters, more particularly to the control of output delays incurred upon transitioning between level states.

BACKGROUND

Level shifters are utilized in a variety of applications in which it is desired to couple a circuit node to either of two voltage levels in dependence upon the state of an input control signal. FIG. 1 is a simplified illustration of a driver applied to a high side FET of a buck converter. The converter comprises FETs 10 and 12, inductor 14 and capacitor 16. The junction of FETs 10 and 12 and inductor 14 is indicated as SW. Various other converter and controller elements are not shown as they are not necessary for explanation of the broad operation. Output $V_{OUT}$ of the converter is maintained at a lower voltage level than the input voltage $V_{IN}$. FETs 10 and 12 are alternatively activated in succession. As $V_{IN}$ is greater than $V_{OUT}$, activation of FET 10 permits charging of output capacitor 16 through inductor 14 as current builds in the inductor. When FET 12 is activated, current through inductor begins to decrease. The time activation of the FET switches is regulated to maintain the output voltage at the desired level.

Activation and deactivation of FET 10 is under the control of driver 18. When FET 10 is in the conductive state, the voltage at its gate exceeds the voltage at the inductor side source. For non-conduction, the gate voltage should not exceed the source voltage. In response to controlled input signals, driver 18 shifts the level of voltage applied to the gate of FET 10 between $V_{BOOST}$ and $V_{SW}$ to control the states of the FET. Capacitor 17 is coupled between the $V_{BOOST}$ and $V_{SW}$ nodes. In a first state, $V_{BOOST}$ is applied to the gate of FET 10. The gate to source voltage, $V_{BOOST}-V_{SW}$ activates FET 10 to a conductive condition. In a second state, $V_{SW}$ is applied to the gate of FET 10. As there is no potential difference between the gate and the source, FET 10 is not conductive.

A known level shifting circuit is illustrated in FIG. 2. An input signal transmission stage 20 comprises PMOS FETs 22 and 24, NMOS FETs 26 and 28 and inverter 30. FETs 22 and 26 are coupled in series across voltage reference line 32 and ground, as are series FETs 24 and 28. The gate of FET 22 is coupled to the drain of FET 28. The gate of FET 24 is coupled to the drain of FET 26. The gate of FET 26 is coupled to a select signal input. The gate of FET 28 is coupled to the select signal input through inverter 30. The output, line N1, of stage 20 is coupled to the junction of the gate of FET 24 and the drain of FET 26.

An output stage 40 comprises PMOS FET 42 coupled in series with NMOS FET 44 across voltage reference line 32 and reference line 34. The junction 36 of FETs 42 and 44 is coupled to the gate of FET 10. In response to controlled input signals, driver 18 shifts the level of voltage $V_{36}$ applied to the gate-source of FET 10 between a level of $V_{BOOST}-V_{SW}$ volts and zero volts. Junction 36 will either be coupled to line 32, $V_{BOOST}$, via FET 42 or to line 34, $V_{SW}$, via FET 44.

Coupled between signal transmission stage 20 and output stage 40 is logic circuit 50. Inverter 52 is coupled between line N1 and one input of NAND gate 54. Inverter 52 is also coupled to one input of NAND gate 56 via inverter 58. The output of NAND gate 54 is coupled to the other input of NAND gate 56. The output of NAND gate 56 is coupled to the other input of NAND gate 54 via inverters 60 and 62. The output of NAND gate 54 is coupled to the gate of FET 42. Inverter 60 is coupled to the gate of FET 44. Logic circuit 50 is responsive to the state of the signal at N1 to provide a gating signal to one of the output stage FETs and prevents simultaneous conduction of both output stage FETs.

With a high level input signal $V_{SIG}$ at stage 20, FET 26 is biased conductive, FET 28 is biased non-conductive, FET 24 is biased conductive, and FET 22 is biased non-conductive. Line N1 is at a low level state under these conditions. The coupling of N1 by inverters 52 and 58 imposes a low level signal to the input of NAND gate 56. NAND gate 56 outputs a high level signal that is inverted by inverter 60. The low level output is applied to FET 44 to bias it to a non-conductive state. Both inputs of NAND gate 54 are at a high level by virtue of inverters 52 and 62. NAND gate 54 outputs a low signal that biases FET 42 to a conductive state. Output line 36 thus is coupled to line 32.

With a low level input signal at stage 20, FET 26 is biased non-conductive, FET 28 is biased conductive, FET 24 is biased non-conductive, and FET 22 is biased conductive. Line N1 is at a high level state under these conditions. The coupling of N1 by inverter 52 imposes a low level signal to the input of NAND gate 54. NAND gate 54 outputs a high level signal to bias FET 42 to a non-conductive state. Both inputs of NAND gate 56 are high to produce a low level output, which is inverted by inverter 60 to bias FET 44 to a conductive state. Output line 36 is thus coupled to line 34.

The level of the input signal to input stage 20 thus selects whether line 36 is coupled to line 32 or line 34. When line 36 is coupled to line 32, output FET is conductive, and when line 36 is coupled to line 34, FET is non-conductive. When the input transitions between level states, delays occur in the input stage 20, as illustrated in FIG. 3. The voltage input signal, $V_{SIG}$, is exemplified by a square wave waveform. Corresponding waveforms for the signals at N1 ($V_{N1}-V_{SW}$) and line 36 ($V_{36}-V_{SW}$) are represented. At time t1, the input signal changes from a low level state to a high level state. In response, N1 changes state from a high level to a low level with a slight delay incurred by the transition of input stage FET 26 to the conductive state. The state of output line 36 then changes from the lower level to the higher level. The total delay between the rising transition of the input signal and the time t2, at which the output line 36 reaches its high state, is relatively short. At time t3, the input signal reverts to the low level state. Input stage FET 22 is responsive to this change in input signal, via interaction of inverter 30 and FET 28, to conduct to provide a high level at N1. Full conduction occurs with a delay that is significantly greater than the transition of FET 22 to non-conduction. The state of output line 36 then changes from the higher level to the lower level at time t4.

The delay of the output in response in response to an input signal transition from high level to low level is significantly greater than the delay in response to the low to high input signal transition. The conventional level shifter produces faster High-to-Low transitions than Low-to-High transitions because FETs 22 and 24 must be made weaker devices than FETs 26 and 28 for proper operation. The prior art circuit thus does not produce a level shift functionality that satisfactorily equalizes transition delays in both directions. A level shift circuit that provides the same rising and falling delay is needed. Capability of making both delays equal to the shorter delay of the prior art circuit would be particularly desirable.

SUMMARY OF THE DISCLOSURE

Transition delays incurred by a level shift circuit can be equalized by generating a first signal having a state directly related to the state of the input signal, generating a second signal having a state inversely related to the state of the input signal, and generating a third signal having a state that is inverse to the state of the second signal. Upon transition of the input signal from a high state to a low state, the third signal is selected for controlling the output until the first signal attains a high state. The first signal is selected for controlling the output when it has reached a high state after the input signal transition. The first signal remains selected upon transition of the input signal from a high state to a low state. By substituting the third signal for the first signal during the slow delay period of the first signal, the delay period seen by the output is replaced by a delay period corresponding to the transition of the second signal. This delay is substantially equal to the faster delay period of the first signal. Thus, output delays are equalized and reduced to the shortest delay.

Delay equalization can be implemented with a circuit such as the following. Controlled switches respectively couple an output to first and second voltage reference nodes in accordance with a high or low signal state at an input to the circuit. A level shifting circuit is coupled between the input and a delay equalization circuit. A logic circuit is coupled between the delay equalization circuit and the controlled switches. The delay equalization circuit includes a reset dominant latch circuit that is coupled to the level shifting circuit and a data selection circuit that is coupled to the level shifting circuit, the latch circuit, and the logic circuit. The logic circuit prevents the output from being coupled simultaneously to first and second voltage reference nodes.

A first variable signal line of the level shifting circuit has a signal state directly related to the signal state of the input. A second variable signal line of the level shifting circuit has a signal state inversely related to the signal state of the input. These signal lines are applied to respective reset and set inputs of the latch circuit. A first input of the data selection circuit receives a state signal having a state directly related to the state of the first variable signal line. A second input of the data select circuit receives a state signal having a state related to inverse of the state of second variable signal line. The data select circuit also has an input coupled to an output of the latch circuit and an output coupled to the logic circuit.

The first variable signal line incurs a first delay in transitioning from a high state level to a low state level and incurs a greater delay in transitioning from a low state level to a high state level. The output signal of the data select circuit exhibits a delay for transition from both high level input to low level input and low level input to high level input that corresponds to the first delay.

BRIEF DESCRIPTION OF THE DRAWINGS

Implementations of the present invention are illustrated by way of example, and not by way of limitation, in the figures of the accompanying drawings and in which like reference numerals refer to similar elements.

DETAILED DESCRIPTION

Figure 1:
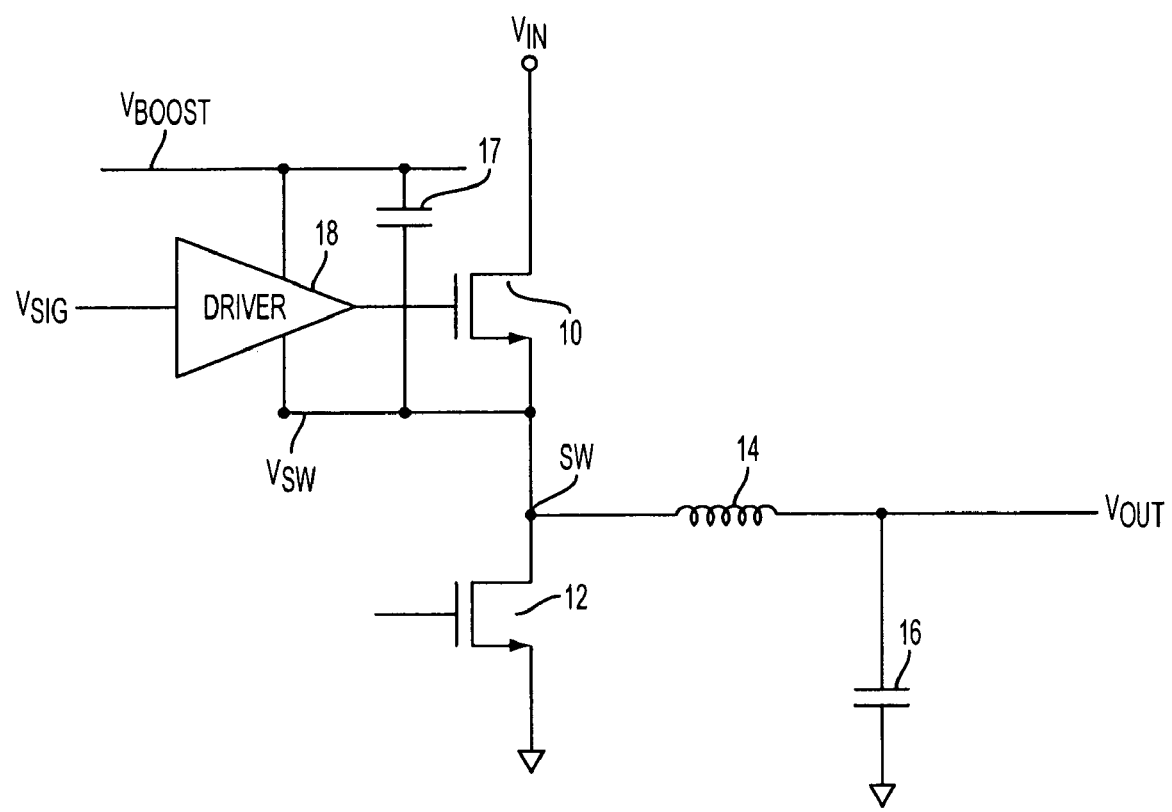
FIG. 1 is a simplified schematic diagram of a converter and FET driver.
Figure 2:
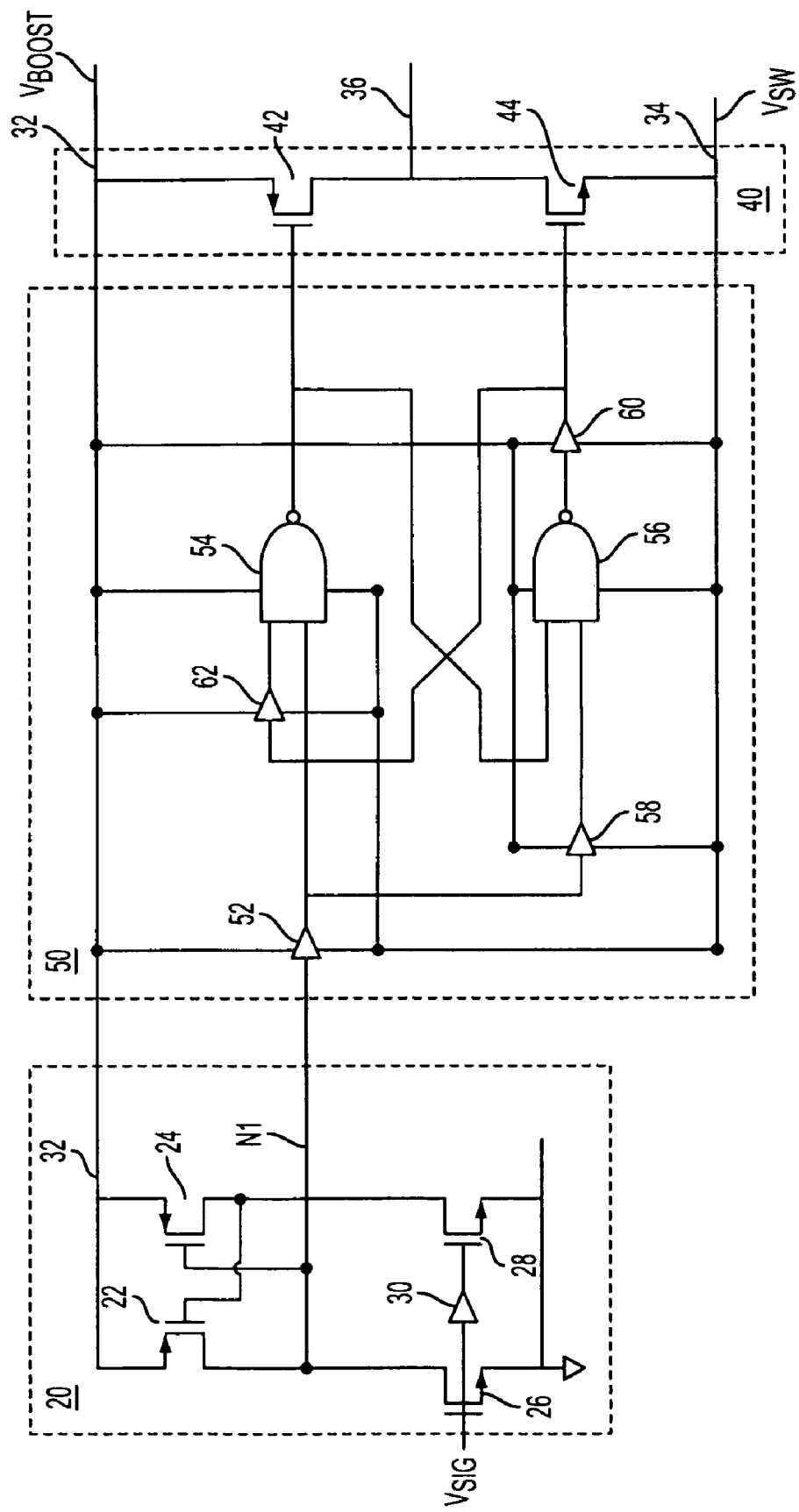
FIG. 2 is a circuit diagram of a prior art level shifting circuit.
Figure 3:
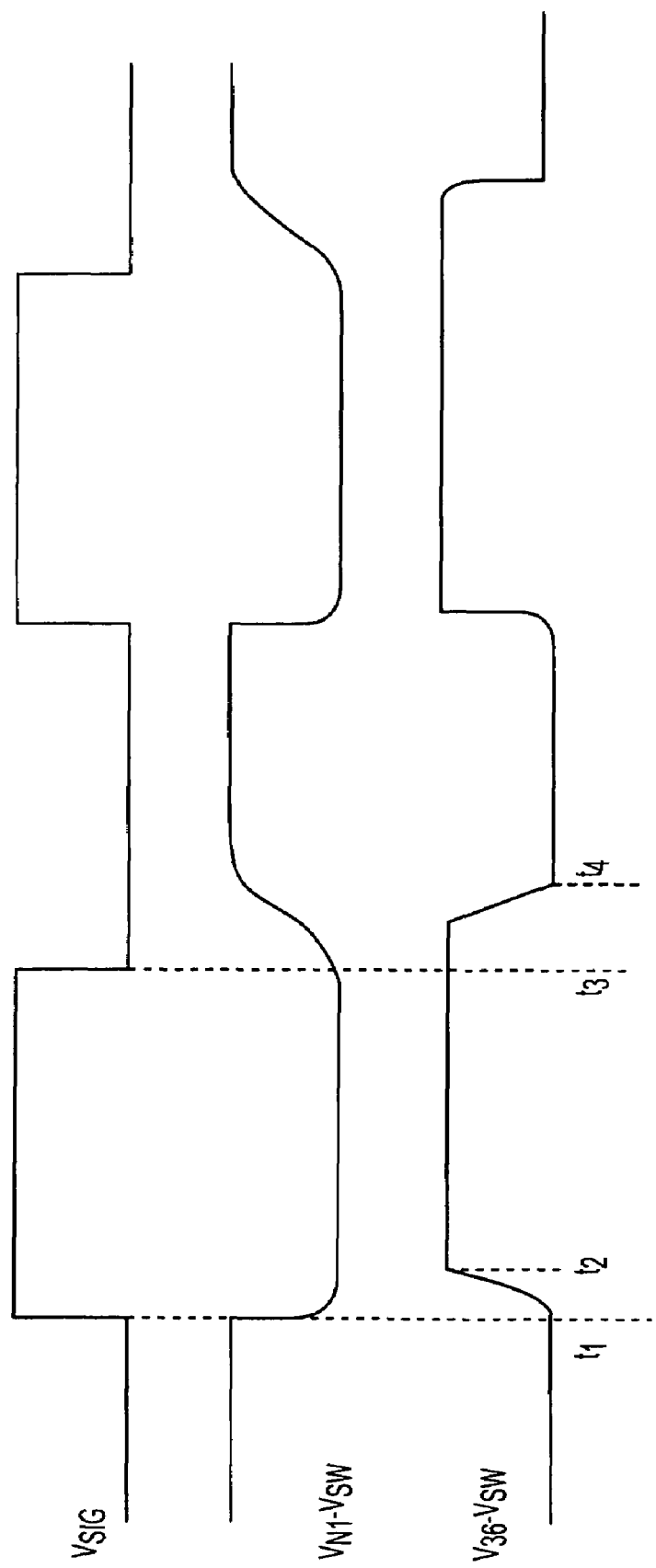
FIG. 3 is a waveform diagram of signals produced by the circuit of FIG. 2.
Figure 4:
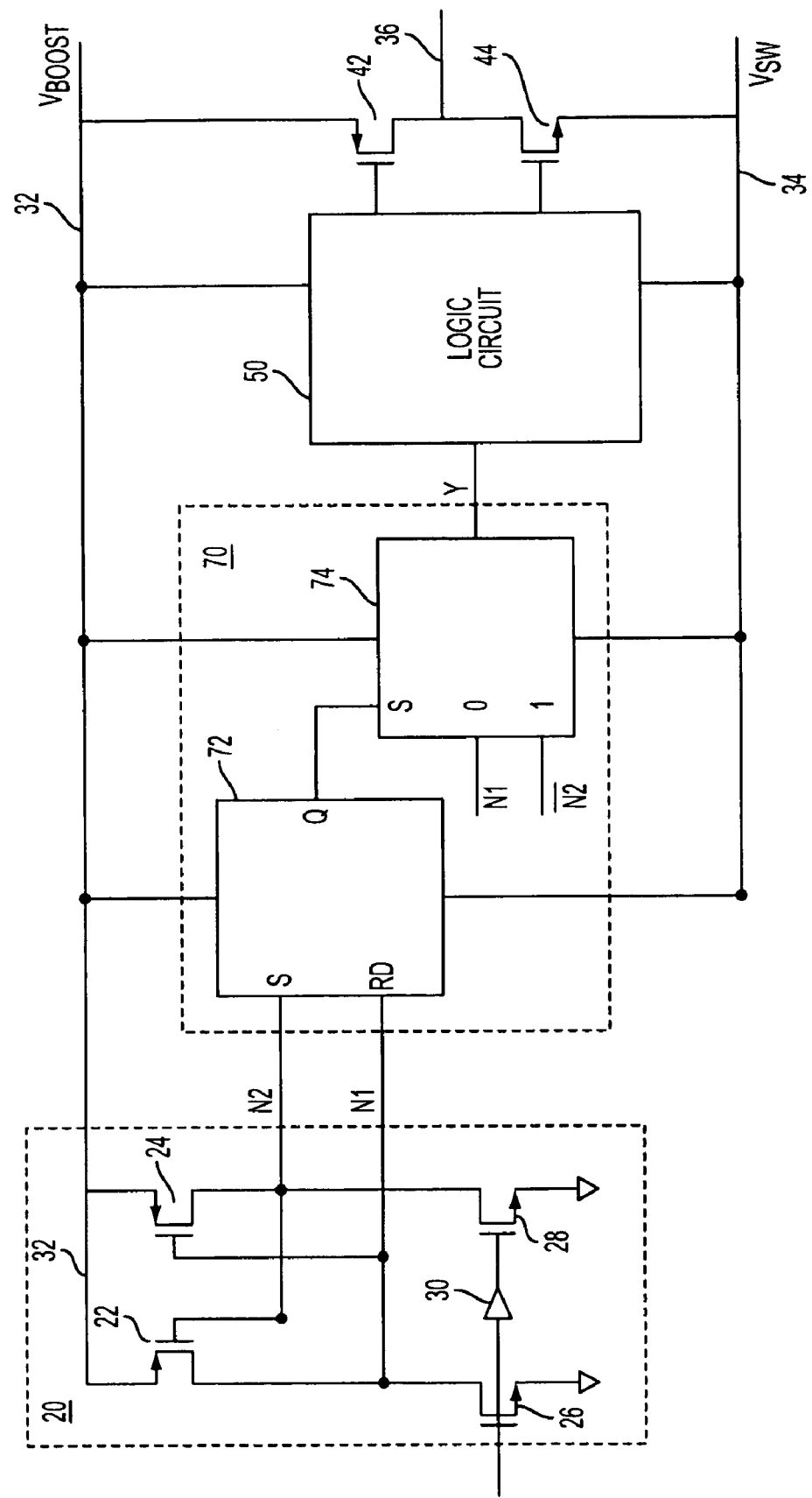
FIG. 4 is a partial block diagram of a level shifting and delay equalization arrangement in accordance with the present invention.

A delay equalization circuit 70 is shown in FIG. 4, interposed between input stage 20 and logic circuit 50 of the level shifting circuit. Input stage 20 and logic circuit 50 may comprise the same circuit element configurations as shown in prior art FIG. 2. Circuit 70 uses the fast High-to-Low transitions on N1 to control the Low-to-High transition of $V_{36}$ and the High-to-Low transitions on N2 to control the High-to-Low transition of $V_{36}$.

Circuit 70 comprises reset dominant latch 72 and data selection circuit 74. Line N1 is coupled to the reset input of latch 72. A line N2 is coupled to the set input of the latch. Line N2 is also coupled to the drain of FET 24. FET 24 is conductive when the input signal is at a high state and is nonconductive when the input signal is at a low state. The Q output of latch 72 is coupled to a select input, S, of data selection circuit 74. A line having the same signal state as N1 is coupled to a 0 input of the data selection circuit. A line having a signal state that is reciprocal to the signal state of N2 is coupled to a 1 input of the data selection circuit. The output Y of the data selection circuit is coupled to the input of the logic circuit 50.

Figure 5:
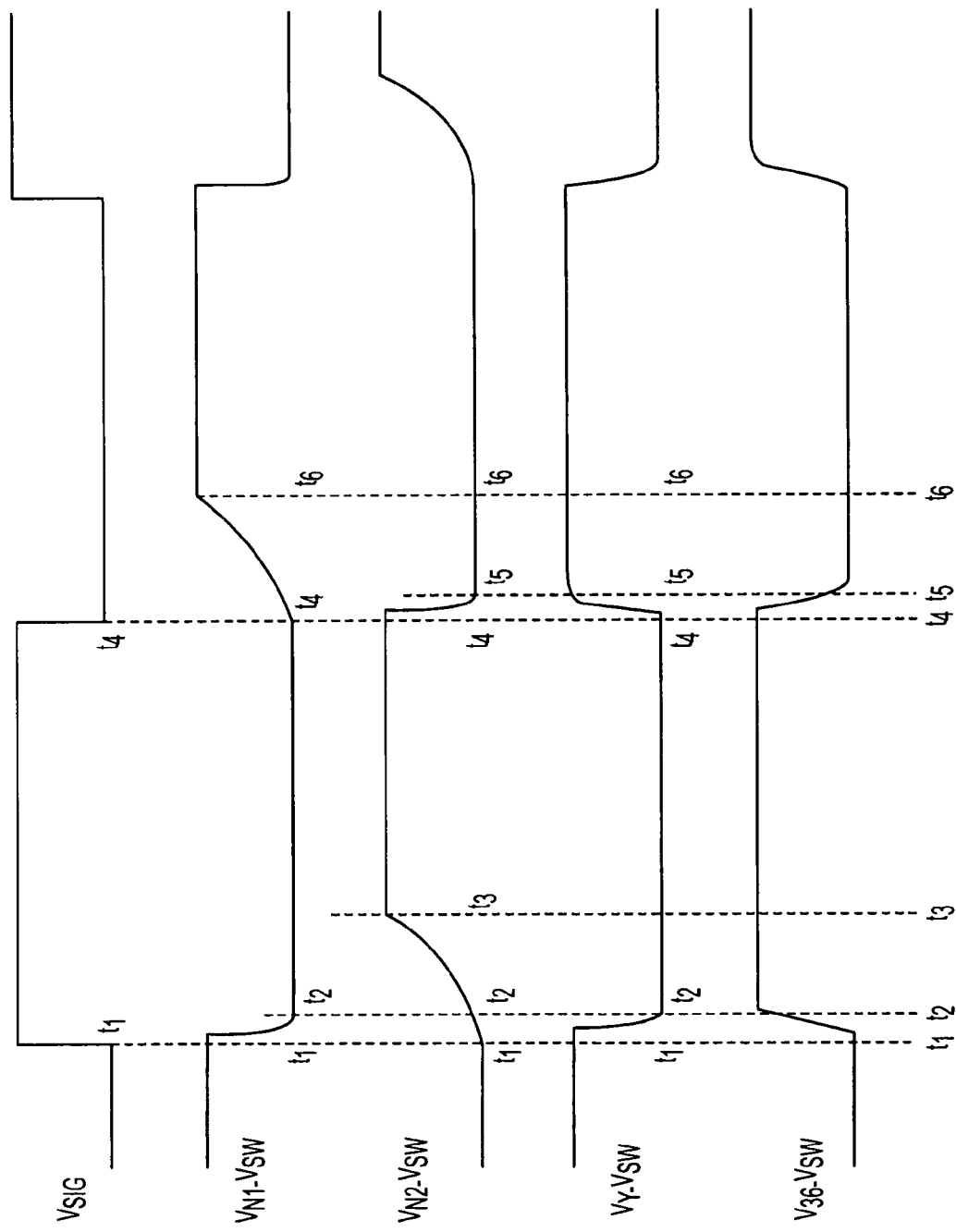
FIG. 5 is a waveform diagram for the arrangement of FIG. 4.

Operation of the arrangement of FIG. 4 is described with respect to the waveforms of FIG. 5. Depicted therein are waveforms for N1 ($V_{N1}$), N2 ($V_{N2}$), Y ($V_Y$) and the output $V_{36}$, as they correspond to the states of the square wave input signal $V_{IN}$. When the input signal $V_{SIG}$ is at a low state, N1 is high and N2 is low. Latch 72 is reset by the high N1 input. The high signal coupled to the S input of data selection circuit 74 incurs application of the high N1 input to the Y line output. Logic circuit 50 outputs high level signals to FETs 42 and 44, thereby coupling line 36 to the low reference line 34.

At time t1, the input signal changes from a low level state to a high level state. In response, N1 changes state from the high level to a low level with a slight delay, at t2, incurred by the transition of input stage FET 26 to the conductive state. N2 reaches a high level at a later time, t3, when FET 24 is fully conductive. Latch 72 remains reset until N2 goes high. The high to low transition of N1 applied by the data selection circuit 74 is applied to the Y line during the reset time. At time t3, latch 72 is set, Q becomes low and /N2 is output at the Y line. As /N2 is low, Y remains low until the next input signal transition. The delay of the N2 line transition does not affect the Y output. Thus, the state of output line 36 changes from the lower level to the higher level at time t2, at only a slight delay after the input signal transition. Logic circuit 50 outputs low level signals to FETs 42 and 44, thereby coupling line 36 to the high reference line 32.

At time t4, the input signal reverts to the low level state. N2 goes low relatively quickly. N1 reaches a high level upon full conduction of FET 22, at time t6. As latch 72 remains set until N1 goes high, /N2 continues to be applied to the Y line by data selection circuit 74 until t6. As the state of /N2 is the reciprocal of the state of N2, /N2 attains a high state at t5, which is applied to the Y line, at only a slight delay after t4. Logic circuit 50 outputs high level signals to FETs 42 and 44, thereby again coupling line 36 to the low reference line 34. At t6, latch 72 is reset and the high N1 input is output by the data selection circuit. The delay between t4 and t5 is of the same duration as the delay between t1 and t2. Delay equalization circuit 70 thus provides for output of a symmetrical square wave waveform that corresponds to the input signal waveform with a minimum delay.

Figure 6:
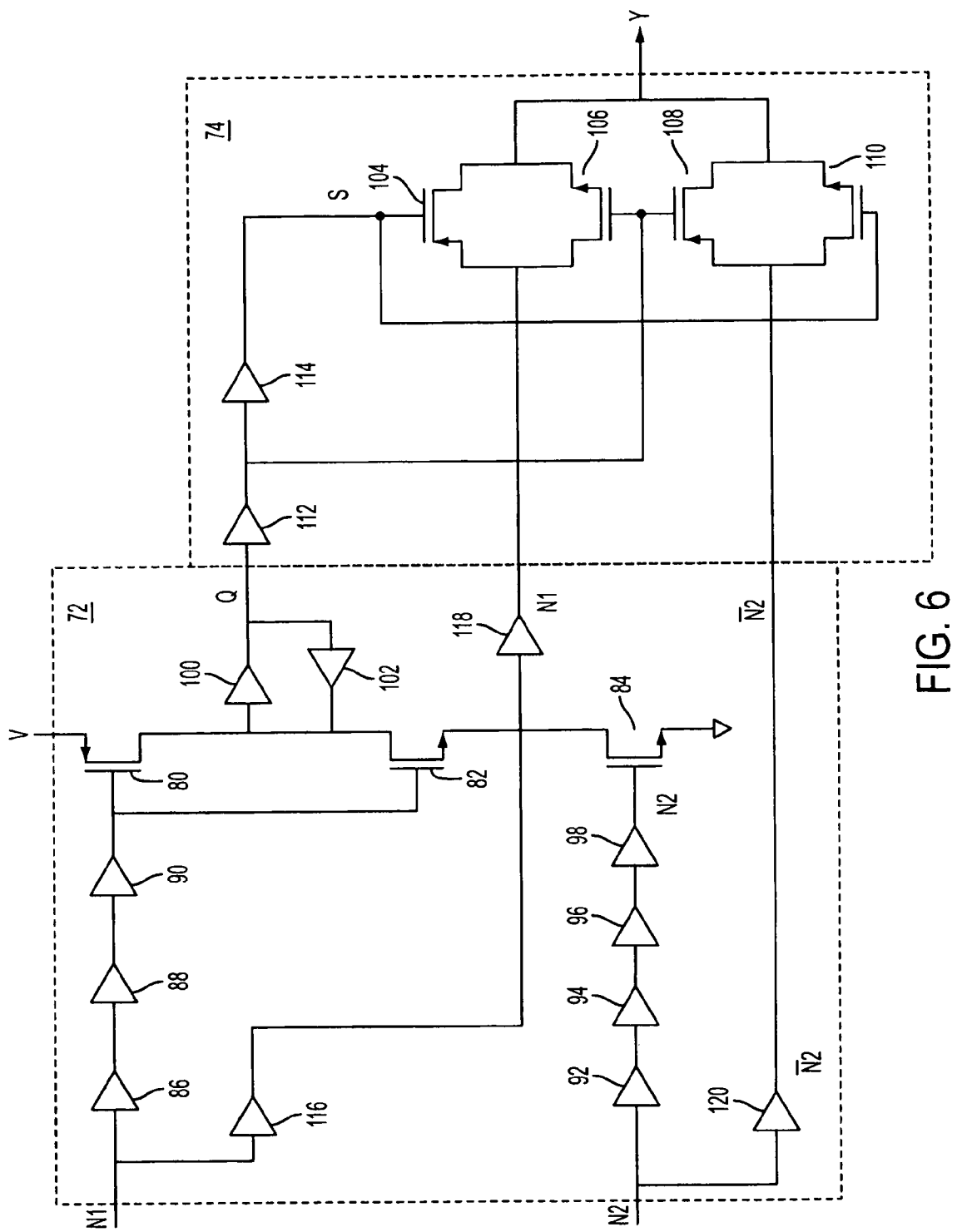
FIG. 6 is a circuit diagram of an example circuit that may be utilized for the delay equalization of FIG. 4.

One example of circuit elements for implementing the delay equalization circuit is shown in FIG. 6. A series arrangement of PMOS FET 80 and NMOS FETS 82 and 84 in latch 72 is coupled across a power source. N1 is coupled to the gate of FET 80 by the series arrangement of inverters 86, 88 and 90. The gates of the complementary FETs 80 and 82 are connected to each other so that their conduction states are mutually exclusive. N2 is coupled to the gate of FET 84 by the series arrangement of inverters 92, 94, 96 and 98. The plurality of inverters in the N1 and N2 couplings are chosen to balance delays in the N1 and N2 signals. Coupled between the junction of the drains of FETs 80 and 82 and node Q of latch 72 is the parallel arrangement of inverters 100 and 102.

Data selection circuit 74 includes a first pair of complementary FETs 104 and 106, coupled in parallel, and a second pair of complementary FETs 108 and 110, coupled in parallel. The gates of FETs 104 and 110 are connected together. The gates of FETs 106 and 108 are connected together. The Q node is coupled to the gates of FETs 106 and 108 through inverter 112. Inverter 112 is coupled to the gates of FETs 104 and 110 through inverter 114. N1 is coupled to a first junction of FETs 104 and 106 by the series arrangement of inverters 116 and 118. A second junction of FETs 104 and 106 is coupled to the Y output. N2 is coupled to a first junction of FETs 108 and 110 by inverter 120. A second junction of FETs 108 and 110 are coupled to the Y output.

The signals from inverters 112 and 114 are complementary to each other. When Q is high, a high signal is applied to the gates of FETs 104 and 110 and a low signal is applied to the gates of FETs 106 and 108. For these states, the FETs 104 and 106 will be non-conductive and the FETs 108 and 110 will be conductive. /N2 will be applied to the Y output line. When Q is low, FETs 104 and 106 will be conductive, FETs 108 and 110 will be non-conductive, and N1 will be applied to the Y output line.

Operation of FIG. 6, utilized as the delay equalization circuit 70 of FIG. 4, corresponding to the waveforms of FIG. 5, is as follows. Prior to t1, the signal $V_{SIG}$ is low. N1 is at high level due to the conductive state of FET 22. FET 80 is conductive by reason of the low level signal at its gate. Latch output Q is at the reset low level. FETs 104 and 106 are rendered conductive to apply the high N1 signal to the Y output. The signal $V_{36}$ at line 36 is low as logic circuit 50 renders FET 44 conductive.

At time t1, $V_{SIG}$ changes from a low to high. In response, N1 changes state from high to low with a slight delay at t2. N2 reaches a high level at a later time, t3, when FET 24 is fully conductive. During this time, the voltage level of N2 is not sufficiently high to render FET 84 conductive and the latch output Q remains in the low reset state. FETs 104 and 106 remain conductive and the high to low transition of N1 is applied to the Y output line. Logic circuit 50 renders FET 42 conductive, thus transitioning $V_{36}$ to the high state. At time t3, both FETs 82 and 84 are conductive, thus setting the latch to provide a high level at Q. FETs 104 and 106 are rendered non-conductive and FETs 108 and 110 are rendered conductive. The low level /N2 signal is output to the Y line and $V_{36}$ remains high.

At time t4, the input signal reverts to the low level state. N2 goes low at t5. FET 84 is rendered non-conductive. N1 reaches a high level upon full conduction of FET 22, at time t6. Between t5 and t6, the latch output Q remains at the high set level to maintain application of /N2 to the Y output line. Y transitions to a high level with the /N2 transition at t5. Logic circuit 50 activates FET 44 to couple output 36 to the low level line 34. $V_{36}$ attains the low state. At t6, FET is rendered conductive to reset the latch output Q to low. The high N1 input is applied to the Y line and the low state of $V_{36}$ is maintained.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example, the delay equalization advantages of the present disclosure are applicable not only to other power converters, such as boost and buck-boost converters, but also to any application in which a level shifting circuit is required. The specifically illustrated logic circuit, latch circuit and data selection circuit can be replaced with equivalent circuits that are operative to produce the functions described.

What is claimed is:

1. A circuit for driving a field-effect transistor (FET) of a power converter, comprising:

an input circuit for receiving an input signal and having a variable input voltage supply;

an output circuit having an output voltage supply independent of the input voltage supply, and having an output node coupled to a gate of the FET;

the output voltage supply including a first node for providing a higher level voltage, and a second node for providing a lower level voltage, controlled switches respectively coupling the output node to the first and second nodes in accordance with a state of the input signal;

a trailing transition accelerating circuit coupled between the input circuit and the output circuit and configured to accelerate transition of a trailing edge of a signal at the output node transitioning between the higher level voltage and the lower level voltage;

a level shifting circuit coupled between the input circuit and the trailing transition accelerating circuit; and a driver circuit coupled between the trailing transition accelerating circuit and the controlled switches;

the trailing transition accelerating circuit including:

a latch circuit coupled to the level shifting circuit; and a data selection circuit coupled to the level shifting circuit, the latch circuit, and the driver circuit.

2. The circuit as recited in claim 1, wherein the state of the input signal is selectable between a high level and a low level, the level shifting circuit comprises a first variable signal line having a signal state of the higher level voltage when the input signal is at the high level and of the lower level voltage when the input signal is at the low level, and a second variable signal line having a state inversely related to the state of the input signal; and the latch circuit is coupled to the output of the level shifter and prevents the output signal from transitioning while the input signal is between the high level and the low level; and the data selection circuit produces a signal selectable between the higher level voltage and the lower level voltage.

3. The circuit as recited in claim 2, wherein the data selection circuit comprises:

a first input coupled to receive a state signal having a state directly related to the state of the first variable signal line;
a second input coupled to receive a state signal having a state related to inverse of the state of second variable signal line;
a third input coupled to the latch circuit; and
an output coupled to a logic circuit;
wherein a signal at the output of the data selection circuit has a state selected in accordance with a signal at the third input to match the state at the first or second inputs of the data selection circuit.

4. A circuit for driving a field-effect transistor (FET) of a power converter, comprising:
an input circuit for receiving an input signal and having a variable input voltage supply;
an output circuit having an output voltage supply independent of the input voltage supply, and having an output node coupled to a gate of the FET;
the output voltage supply including a first node for providing a higher level voltage, and a second node for providing a lower level voltage,
controlled switches respectively coupling the output node to the first and second nodes in accordance with a state of the input signal;
a trailing transition accelerating circuit coupled between the input circuit and the output circuit and configured to accelerate transition of a trailing edge of a signal at the output node transitioning between the higher level voltage and the lower level voltage;
a level shifting circuit coupled between the input circuit and the trailing transition accelerating circuit; and
a driver circuit coupled between the trailing transition accelerating circuit and the controlled switches;
the trailing transition accelerating circuit including:
a latch circuit coupled to the level shifting circuit; and
a data selection circuit coupled to the level shifting circuit, the latch circuit, and the driver circuit,
wherein the state of the input signal is selectable between a high level and a low level,
the level shifting circuit comprises a first variable signal line having a signal state of the higher level voltage when the input signal is at the high level and of the lower level voltage when the input signal is at the low level,
the signal of the first variable signal line incurs a first delay in transitioning from a first state level to a second state level and incurs a greater delay in transitioning from the second state level to the first state level; and
an output signal of the data selection circuit exhibits a delay for transition from both first level input to second level input and second level input to first level input that corresponds to the first delay.

5. The circuit as recited in claim 3, wherein the latch circuit comprises a reset dominant latch, the first input of the latch comprising a reset node, and the second input of the latch comprising a set node.

6. The circuit as recited in claim 3, wherein the logic circuit is configured to prevent the output from being coupled simultaneously to the first and second nodes.

7. A method of driving a field-effect transistor (FET) of a power converter, the method comprising the steps of:
receiving a bi-state input signal by an input circuit having an input power supply to provide shifting of a voltage level of an output signal at a gate of the FET between a variable higher level voltage and a variable lower level voltage of an output power supply independent from the input power supply;
generating a first signal having a state directly related to the state of the input signal;
generating a second signal having a state inversely related to the state of the input signal;
generating a third signal having a state that is inverse to the state of the second signal; and
upon transition of the input signal from a high state to a low state, accelerating respective transition of a trailing edge of the output signal by selecting the third signal until the first signal attains the same state as the third signal.

8. The method as recited in claim 7, further comprising selecting the first signal when it has reached the first state after the input signal transition.

9. The method as recited in claim 8, further comprising, selecting the first signal upon transition of the input signal from a low state to a high state.

10. The method as recited in claim 9 further comprising, connecting an output to the higher level voltage or the lower level voltage in response to the state of signals selected in the selecting steps.

11. The method as recited in claim 8, further comprising:
applying the first signal to a reset node of a latch circuit; and
applying the second signal to a set node of the latch circuit;
wherein the first and third signals are selected in response to the state of the latch circuit.

12. The circuit of claim 1, wherein the lower level voltage varies in a range from 0 to an input voltage of the converter.

13. The method of claim 7, wherein the lower level voltage varies in a range from 0 to an input voltage of the converter.

14. The circuit of claim 4, the level shifting circuit further comprises a second variable signal line having a state inversely related to the state of the input signal; and
the latch circuit is coupled to the output of the level shifter and prevents the output signal from transitioning while the input signal is between the high level and the low level; and
the data selection circuit produces a signal selectable between the higher level voltage and the lower level voltage.

15. The circuit of claim 14, wherein the data selection circuit comprises:
a first input coupled to receive a state signal having a state directly related to the state of the first variable signal line;
a second input coupled to receive a state signal having a state related to inverse of the state of second variable signal line;
a third input coupled to the latch circuit; and
an output coupled to a logic circuit;
wherein a signal at the output of the data selection circuit has a state selected in accordance with a signal at the third input to match the state at the first or second inputs of the data selection circuit.

16. The circuit of claim 15, wherein the latch circuit comprises a reset dominant latch, the first input of the latch comprising a reset node, and the second input of the latch comprising a set node.

17. The circuit of claim 15, wherein the logic circuit is configured to prevent the output from being coupled simultaneously to the first and second nodes.

* * * * *